US006484244B1

(12) United States Patent
Manning

(10) Patent No.: US 6,484,244 B1
(45) Date of Patent: *Nov. 19, 2002

(54) METHOD AND SYSTEM FOR STORING AND PROCESSING MULTIPLE MEMORY COMMANDS

(75) Inventor: Troy A. Manning, Meridian, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/877,191

(22) Filed: Jun. 17, 1997

(51) Int. Cl.$^7$ .............................................. G06F 13/18
(52) U.S. Cl. .................... 711/154; 711/105; 365/230.03
(58) Field of Search .............................. 711/5, 101, 104, 711/105, 154, 157, 168, 169; 365/230.03

(56) References Cited

U.S. PATENT DOCUMENTS

| 4,312,068 A | 1/1982 | Goss et al. ..................... 371/37 |
| 4,365,295 A | 12/1982 | Katzman et al. ............. 364/200 |
| 4,630,230 A | 12/1986 | Sundet ........................ 364/900 |

(List continued on next page.)

FOREIGN PATENT DOCUMENTS

| DE | 197 34 719 A1 | 5/1998 |
| EP | 59116829 | 7/1984 |
| EP | 0 468 480 A2 | 5/1992 |

(List continued on next page.)

OTHER PUBLICATIONS

"Increasing Data Read Rate From Memories," IBM Technical Disclosure Bulletin, vol. 30, No. 12, May 1988, pp. 339–341.

Gillingham, P., "SLDRAM Architectural and Functional Overview," SLDRAM Consortium, Aug. 29, 1997, pp. 1–14.

Descriptive literature entitled, "400 MHz SLDRAM, 4M×16 SLDRAM Pipelined, Eight Bank, 2.5 V Operation," pp. 1–22.

"Draft Standard for a High–Speed Memory Interface (Sync Link)," Microprocessor and Microcomputer Standards Subcommittee of the IEEE Computer Society, Copyright 1996 by the Institute of Electrical and Electronics Engineers, Inc., New York, NY, pp. 1–56.

Prince, Betty, "High Performance Memories," John Wiley & Sons Ltd., West Sussex, England, 1996, pp. 143–146.

*Primary Examiner*—Kevin L. Ellis
(74) *Attorney, Agent, or Firm*—Dorsey & Whitney LLP

(57) ABSTRACT

A packetized dynamic random access memory ("DRAM") receives command packets each of which contain a plurality of packet words. The packet words in each command packet are combined to produce a command word. A portion of a command word for each command packet is stored in one of a plurality of command units so that a plurality of packet words may be stored in respective command units at the same time. The command units then generate respective command signals corresponding to the stored command word, with command signals being generated by only one command unit at a time. A control circuit prevents each command word from being stored in more than one command unit, and prevents a command word from overwriting a command word stored in a command unit before command signals have been generated from the stored command word. The control circuit arranges the command units in a hierarchy, and enables a command unit to store a command word only if the command unit is not busy and all of the command units having a higher hierarchy are busy.

49 Claims, 8 Drawing Sheets

U.S. PATENT DOCUMENTS

| | | | | |
|---|---|---|---|---|
| 4,695,952 | A | 9/1987 | Howland | 364/200 |
| 4,768,190 | A | 8/1988 | Giancarlo | 370/86 |
| 4,845,664 | A | 7/1989 | Aichelmann, Jr. et al. | 364/900 |
| 4,849,702 | A | 7/1989 | West et al. | 328/63 |
| 4,920,282 | A | 4/1990 | Muraoka et al. | 307/442 |
| 4,943,946 | A | 7/1990 | Brent | 365/189.12 |
| 4,949,301 | A | 8/1990 | Joshi et al. | 364/900 |
| 5,099,481 | A | 3/1992 | Miller | 371/22.1 |
| 5,175,732 | A | 12/1992 | Hendel et al. | 370/94.1 |
| 5,235,595 | A | 8/1993 | O'Dowd | 370/94.1 |
| 5,297,029 | A | 3/1994 | Nakai et al. | 365/238.5 |
| 5,309,432 | A | 5/1994 | Kanakia | 370/60 |
| 5,321,399 | A | 6/1994 | Notani et al. | 341/100 |
| 5,321,700 | A | 6/1994 | Brown et al. | 371/27 |
| 5,325,493 | A | 6/1994 | Herrell et al. | 395/375 |
| 5,337,410 | A | 8/1994 | Appel | 395/162 |
| 5,355,345 | A | 10/1994 | Dickinson et al. | 365/230.01 |
| 5,367,643 | A | 11/1994 | Chang et al. | 395/325 |
| 5,381,536 | A | 1/1995 | Phelps et al. | 395/375 |
| 5,386,390 | A | 1/1995 | Okitaka | 365/230.06 |
| 5,390,224 | A | 2/1995 | Komatsuda | 377/56 |
| 5,402,390 | A | 3/1995 | Ho et al. | 365/225.7 |
| 5,454,093 | A | 9/1995 | Abdulhafiz et al. | 395/460 |
| 5,463,340 | A | 10/1995 | Takabatake et al. | 327/211 |
| 5,471,430 | A | 11/1995 | Sawada et al. | 365/222 |
| 5,553,010 | A | 9/1996 | Tanihira et al. | 364/715.08 |
| 5,557,763 | A | 9/1996 | Senter et al. | 395/375 |
| 5,566,325 | A | 10/1996 | Bruce, II et al. | 395/494 |
| 5,581,512 | A | 12/1996 | Kitamura | 365/233 |
| 5,600,605 | A | 2/1997 | Schaefer | 365/233 |
| 5,615,355 | A | * 3/1997 | Wagner | 711/167 |
| 5,636,174 | A | 6/1997 | Rao | 365/230.03 |
| 5,640,354 | A | 6/1997 | Jang et al. | 365/201 |
| 5,652,733 | A | 7/1997 | Chen et al. | 365/233 |
| 5,701,434 | A | 12/1997 | Nakagawa | 395/484 |
| 5,713,005 | A | 1/1998 | Proebsting | 395/496 |
| 5,732,041 | A | 3/1998 | Joffe | 365/230.08 |
| 5,737,563 | A | 4/1998 | Shigeeda | 365/230.03 |
| 5,742,760 | A | 4/1998 | Picazo, Jr. et al. | 709/249 |
| 5,764,584 | A | 6/1998 | Fukiage et al. | 365/230.03 |
| 5,778,419 | A | 7/1998 | Hansen et al. | 711/112 |
| 5,793,688 | A | 8/1998 | McLaury | 365/203 |
| 5,793,996 | A | 8/1998 | Childers et al. | 710/129 |
| 5,812,074 | A | 9/1998 | Chung | 341/67 |
| 5,813,023 | A | 9/1998 | McLaury | 711/105 |
| 5,825,711 | A | 10/1998 | Manning | 365/230.03 |
| 5,831,929 | A | 11/1998 | Manning | 365/233 |
| 5,835,925 | A | 11/1998 | Kessler et al. | 711/2 |
| 5,838,990 | A | 11/1998 | Park et al. | 395/834 |
| 5,848,431 | A | 12/1998 | Pawlowski | 711/5 |
| 5,860,080 | A | 1/1999 | James et al. | 711/4 |
| 5,887,146 | A | 3/1999 | Baxter et al. | 395/284 |
| 5,907,860 | A | 5/1999 | Garibay, Jr. et al. | 711/117 |
| 5,907,864 | A | 5/1999 | Potts et al. | 711/169 |
| 5,920,510 | A | 7/1999 | Yukutake et al. | 365/189.05 |
| 5,920,710 | A | * 7/1999 | Tan et al. | 712/216 |
| 5,946,260 | A | * 8/1999 | Manning | 365/230.03 |
| 5,954,804 | A | 9/1999 | Farmwald et al. | 710/36 |
| 5,996,043 | A | 11/1999 | Manning | 711/105 |
| 6,032,220 | A | 2/2000 | Martin et al. | 711/5 |
| 6,032,232 | A | 2/2000 | Lindeborg et al. | 711/149 |
| 6,035,369 | A | 3/2000 | Ware et al. | 711/105 |
| 6,055,615 | A | 4/2000 | Okajima | 711/169 |
| 6,175,894 | B1 | 1/2001 | Manning | 711/109 |
| 6,175,905 | B1 | 1/2001 | Manning | 711/169 |
| 6,178,488 | B1 | 1/2001 | Manning | 711/169 |
| 6,212,601 | B1 | 4/2001 | Shiell | 711/118 |
| 6,223,265 | B1 | 4/2001 | Kawasaki et al. | 711/167 |
| 6,266,750 | B1 | 7/2001 | DeMone et al. | 711/169 |

FOREIGN PATENT DOCUMENTS

| | | |
|---|---|---|
| EP | 0 486 480 A2 | 5/1992 |
| EP | 0 605 887 A2 | 7/1994 |
| GB | 2 128 383 A | 4/1984 |
| JP | 09161475 | 6/1997 |
| WO | WO 96/24935 | 8/1996 |

* cited by examiner

METHOD AND SYSTEM FOR STORING AND PROCESSING MULTIPLE MEMORY COMMANDS

TECHNICAL FIELD

This invention relates to memory devices used in computer systems, and, more particularly, to a method and apparatus for the pipelined processing of multiple memory commands.

BACKGROUND OF THE INVENTION

Conventional computer systems include a processor (not shown) coupled to a variety of memory devices, including read-only memories ("ROMs") which traditionally store instructions for the processor, and a system memory to which the processor may write data and from which the processor may read data. The processor may also communicate with an external cache memory, which is generally a static random access memory ("SRAM"). The processor also communicates with input devices, output devices, and data storage devices.

Processors generally operate at a relatively high speed. Processors such as the Pentium® and Pentium Pro® microprocessors are currently available that operate at clock speeds of at least 200 MHz. However, the remaining components of existing computer systems, with the exception of SRAM cache, are not capable of operating at the speed of the processor. For this reason, the system memory devices, as well as the input devices, output devices, and data storage devices, are not coupled directly to the processor bus. Instead, the system memory devices are generally coupled to the processor bus through a memory controller, bus bridge or similar device, and the input devices, output devices, and data storage devices are coupled to the processor bus through a bus bridge. The memory controller allows the system memory devices to operate with a clock frequency that is substantially lower than the clock frequency of the processor. Similarly, the bus bridge allows the input devices, output devices, and data storage devices to operate with a clock frequency that is substantially lower than the clock frequency of the processor. Currently, for example, a processor having a 200 MHz clock frequency may be mounted on a mother board having a 66 MHz clock frequency that is used for controlling the system memory devices and other components.

Access to system memory is a frequent operation for the processor. The time required for the processor, operating, for example, at 200 MHz, to read data from or write data to a system memory device operating at, for example, 66 MHz, greatly slows the rate at which the processor is able to accomplish its operations. Thus, much effort has been devoted to increasing the operating speed of system memory devices.

System memory devices are generally dynamic random access memories ("DRAMs"). Initially, DRAMs were asynchronous and thus did not operate at even the clock speed of the motherboard. In fact, access to asynchronous DRAMs often required that wait states be generated to halt the processor until the DRAM had completed a memory transfer. However, the operating speed of asynchronous DRAMs was successfully increased through such innovations as burst and page mode DRAMs, which did not require that an address be provided to the DRAM for each memory access. More recently, synchronous dynamic random access memories ("SDRAMs") have been developed to allow the pipelined transfer of data at the clock speed of the motherboard. However, even SDRAMs are incapable of operating at the clock speed of currently available processors. Thus, SDRAMs cannot be connected directly to the processor bus, but instead must interface with the processor bus through a memory controller, bus bridge, or similar device. The disparity between the operating speed of the processor and the operating speed of SDRAMs continues to limit the speed at which processors may complete operations requiring access to system memory.

A solution to this operating speed disparity has been proposed in the form of a computer architecture known as "SyncLink." In the SyncLink architecture, the system memory may be coupled to the processor directly through the processor bus. Rather than requiring that separate address and control signals be provided to the system memory, SyncLink memory devices receive command packets that include both control and address information. The SyncLink memory device then outputs or receives data on a data bus that is coupled directly to the data bus portion of the processor bus.

An example of a computer system 10 using a SyncLink packetized DRAM architecture is shown in FIG. 2. The computer system 10 includes a processor 12 having a processor bus 14 coupled to three packetized dynamic random access memory or SyncLink DRAMs ("SLDRAM") devices 16a–c either directly (as shown) or through a memory controller or the like (not shown). The computer system 10 also includes one or more input devices 20, such as a keypad or a mouse, coupled to the processor 12 through a bus bridge 22 and an expansion bus 24, such as an industry standard architecture ("ISA") bus or a peripheral component interconnect ("PCI") bus. The input devices 20 allow an operator or an electronic device to input data to the computer system 10. One or more output devices 30 are coupled to the processor 12 to display or otherwise output data generated by the processor 12. The output devices 30 are coupled to the processor 12 through the expansion bus 24, bus bridge 22 and processor bus 14. Examples of output devices 24 include printers and a video display units. One or more data storage devices 38 are coupled to the processor 12 through the processor bus 14, bus bridge 22, and expansion bus 24 to store data in or retrieve data from storage media (not shown). Examples of storage devices 38 and storage media include fixed disk drives floppy disk drives, tape cassettes and compact-disk read-only memory drives.

In operation, the processor 12 communicates with the memory devices 16a–c via the processor bus 14 by sending the memory devices 16a–c command packets that contain both control and address information. Data is coupled between the processor 12 and the memory devices 16a–c, through a data bus portion of the processor bus 14. Although all the memory devices 16a–c are coupled to the same conductors of the processor bus 14, only one memory device 16a–c at a time reads or writes data, thus avoiding bus contention on the processor bus 14. Bus contention is avoided by each of the memory devices 16a–c and the bus bridge 22 having a unique identifier, and the command packet contains an identifying code that selects only one of these components.

The computer system 10 also includes a number of other components and signal lines that have been omitted from FIG. 1 in the interests of brevity. For example, as explained below, the memory devices 16a–c also receive a master clock signal to provide internal timing signals, a data clock signal clocking data into and out of the memory device 16, and a FLAG signal signifying the start of a command packet.

The memory devices 16 are shown in block diagram form in FIG. 2. Each of the memory devices 16 includes a clock divider and delay circuit 40 that receives a master clock signal 42 and generates a large number of other clock and timing signals to control the timing of various operations in the memory device 16. The memory device 16 also includes a command buffer 46 and an address capture circuit 48 which receive an internal clock CLK signal, a command packet CA0–CA9 on a command bus 50, and a FLAG signal on line 52. As explained above, the command packet contains control and address information for each memory transfer, and the FLAG signal identifies the start of a command packet. The command buffer 46 receives the command packet from the bus 50, and compares at least a portion of the command packet to identifying data from an ID register 56 to determine if the command packet is directed to the memory device 16a or some other memory device 16b, c. If the command buffer 46 determines that the command is directed to the memory device 16a, it then provides the command to a command decoder and sequencer 60. The command decoder and sequencer 60 generates a large number of internal control signals to control the operation of the memory device 16a during a memory transfer corresponding to the command.

The address capture circuit 48 also receives the command packet from the command bus 50 and outputs a 20-bit address corresponding to the address information in the command. The address is provided to an address sequencer 64 which generates a corresponding 3-bit bank address on bus 66, an 11-bit row address on bus 68, and a 6-bit column address on bus 70.

One of the problems of conventional DRAMs is their relatively low speed resulting from the time required to precharge and equilibrate circuitry in the DRAM array. The packetized DRAM 16a shown in FIG. 3 largely avoids this problem by using a plurality of memory banks 80, in this case eight memory banks 80a–h. After a memory read from one bank 80a, the bank 80a can be precharged while the remaining banks 80b–h are being accessed. Each of the memory banks 80a–h receives a row address from a respective row latch/decoder/driver 82a–h. All of the row latch/decoder/drivers 82a–h receive the same row address from a predecoder 84 which, in turn, receives a row address from either a row address register 86 or a refresh counter 88 as determined by a multiplexer 90. However, only one of the row latch/decoder/drivers 82a–h is active at any one time as determined by bank control logic 94 as a function of a bank address from a bank address register 96.

The column address on bus 70 is applied to a column latch/decoder 100 which, in turn, supplies I/O gating signals to an I/O gating circuit 102. The I/O gating circuit 102 interfaces with columns of the memory banks 80a–h through sense amplifiers 104. Data is coupled to or from the memory banks 80a–h through the sense amplifiers 104 and I/O gating circuit 102 to a data path subsystem 108 which includes a read data path 110 and a write data path 112. The read data path 110 includes a read latch 120 receiving and storing data from the I/O gating circuit 102. In the memory device 16a shown in FIG. 2, 64 bits of data are applied to and stored in the read latch 120. The read latch then provides four 16-bit data words to a multiplexer 122. The multiplexer 122 sequentially applies each of the 16-bit data words to a read FIFO buffer 124. Successive 16-bit data words are clocked through the FIFO buffer 124 by a clock signal generated from an internal clock by a programmable delay circuit 126. The FIFO buffer 124 sequentially applies the 16-bit words and two clock signals (a clock signal and a quadrature clock signal) to a driver circuit 128 which, in turn, applies the 16-bit data words to a data bus 130 forming part of the processor bus 14. The driver circuit 128 also applies the clock signals to a clock bus 132 so that a device such as the processor 12 reading the data on the data bus 130 can be synchronized with the data.

The write data path 112 includes a receiver buffer 140 coupled to the data bus 130. The receiver buffer 140 sequentially applies 16-bit words from the data bus 130 to four input registers 142, each of which is selectively enabled by a signal from a clock generator circuit 144. Thus, the input registers 142 sequentially store four 16-bit data words and combine them into one 64-bit data word applied to a write FIFO buffer 148. The write FIFO buffer 148 is clocked by a signal from the clock generator 144 and an internal write clock WCLK to sequentially apply 64-bit write data to a write latch and driver 150. The write latch and driver 150 applies the 64-bit write data to one of the memory banks 80a–h through the I/O gating circuit 102 and the sense amplifier 104.

As mentioned above, an important goal of the SyncLink architecture is to allow data transfer between a processor and a memory device to occur at a significantly faster rate. However, the operating rate of a packetized DRAM, including the packetized DRAM 16a shown in FIG. 2, is limited by the time required to process command packets applied to the memory device 16a. The rate at which command packets can be provided to the memory device 16a is limited by the time required to store and processes the command packets.

Although the foregoing discussion is directed to the need for faster command processing in packetized DRAMs, similar problems exist in other memory devices, such as asynchronous DRAMs and synchronous DRAMs, which must process control and other signals at a high rate of speed. Thus, for the reasons explained above, the time required to perform command processing in conventional DRAMS threatens to severely limit the maximum operating speed of memory devices, particularly packetized DRAMs. Therefore, there is a need to be able to receive memory commands, particularly command packets for packetized DRAMs, at a rate that is faster than the rate that the memory commands can sometimes be processed.

SUMMARY OF THE INVENTION

A system and method for receiving a plurality of command packets each of which contain at least one packet word, and generating from at least part of the packet word at least one corresponding command signal. A command buffer receives and stores at least one packet word for each packet, and applies each packet word to a command bus. A plurality of command units are coupled to the command bus. Each of the command units stores at least a portion of a packet word received from the command buffer responsive to a respective select signal. Each of the command units generates a busy signal indicating that a portion of a packet word has been stored in the respective command unit. The command unit generates on a respective output terminal at least one command signal corresponding to the portion of the packet word stored in the command unit. A control circuit receives the busy signals from the respective command units to determine which of the command units are storing a portion of a packet word. The control circuit then applies a respective select signal to one of the command units from which a busy signal is not being received to cause the command unit receiving the select signal to store the portion of the packet word received from the command buffer. The control circuit preferably includes a plurality of latches and associated logic circuits corresponding in number to the number of command units in the system. Each of the latches receives a busy signal from a respective command unit, stores the received busy signal responsive to a latch signal, and outputs the stored busy signal on an output terminal. The logic circuits and latches to which they are coupled are assigned a predetermined hierarchy. Each of the logic circuits generates a select signal that is applied to a respective command unit responsive to the absence of a stored busy signal at the output terminal of the respective latch and the presence of a stored busy signal at the output terminal of latches that are lower in the hierarchy. The command processing system and method is particularly adapted for use in a packetized DRAM which may then be used as part of a computer system.

DETAILED DESCRIPTION OF THE INVENTION

Figure 1:
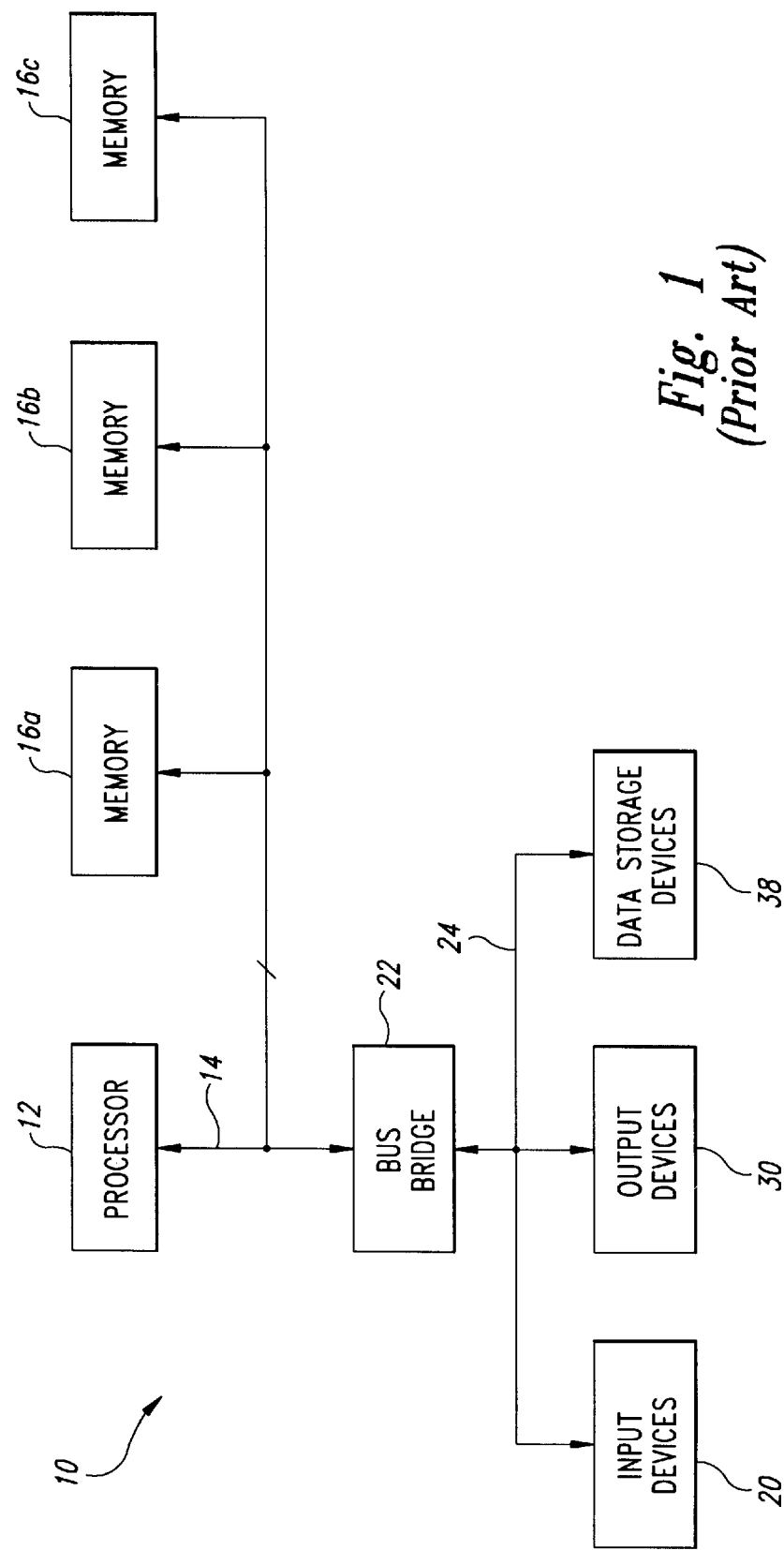
FIG. 1 is a block diagram of a computer system using a plurality of packetized memory devices.
Figure 2:
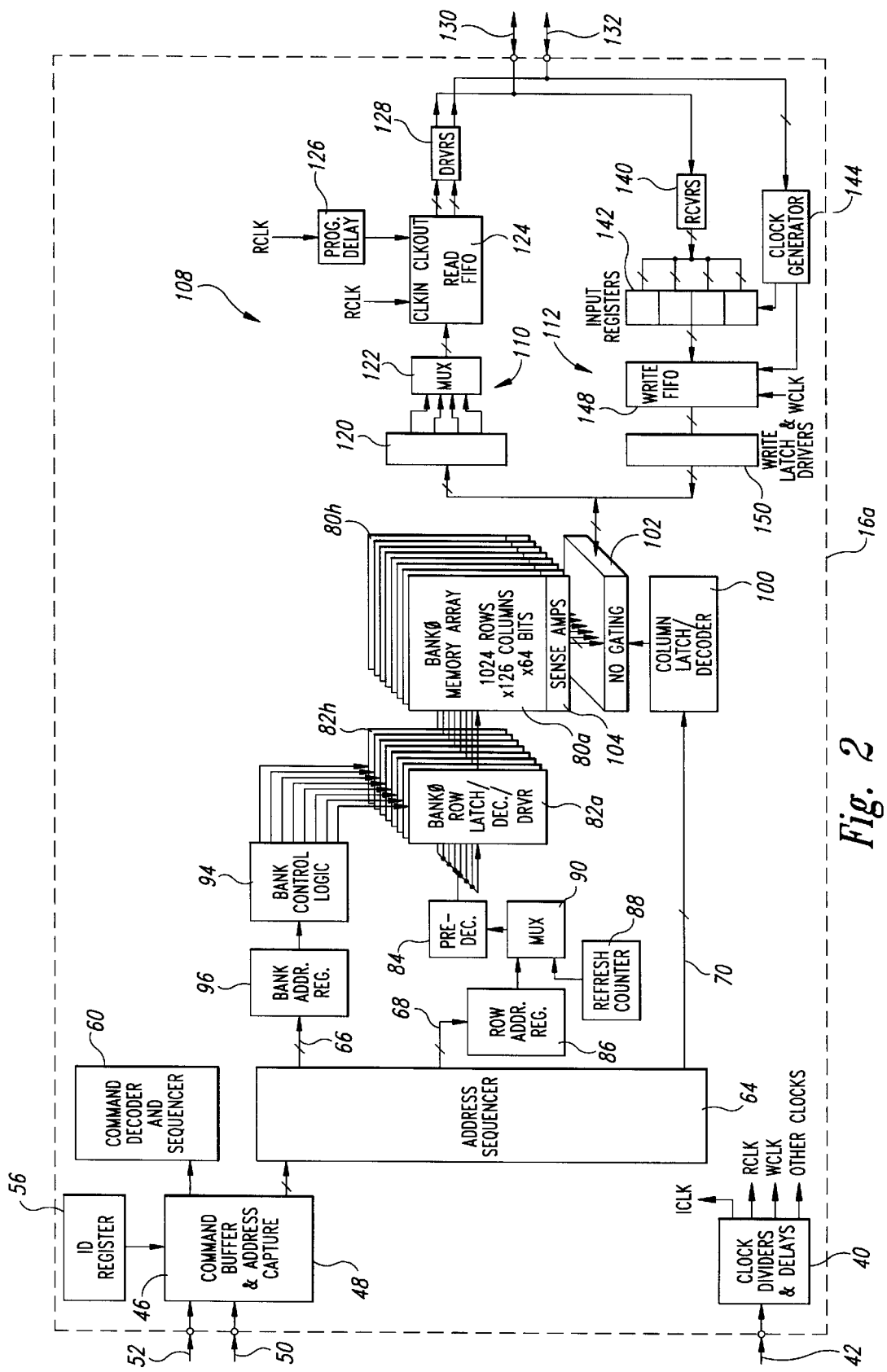
FIG. 2 is a block diagram of a packetized DRAM that may be used in the computer system of FIG. 1.
Figure 3A:
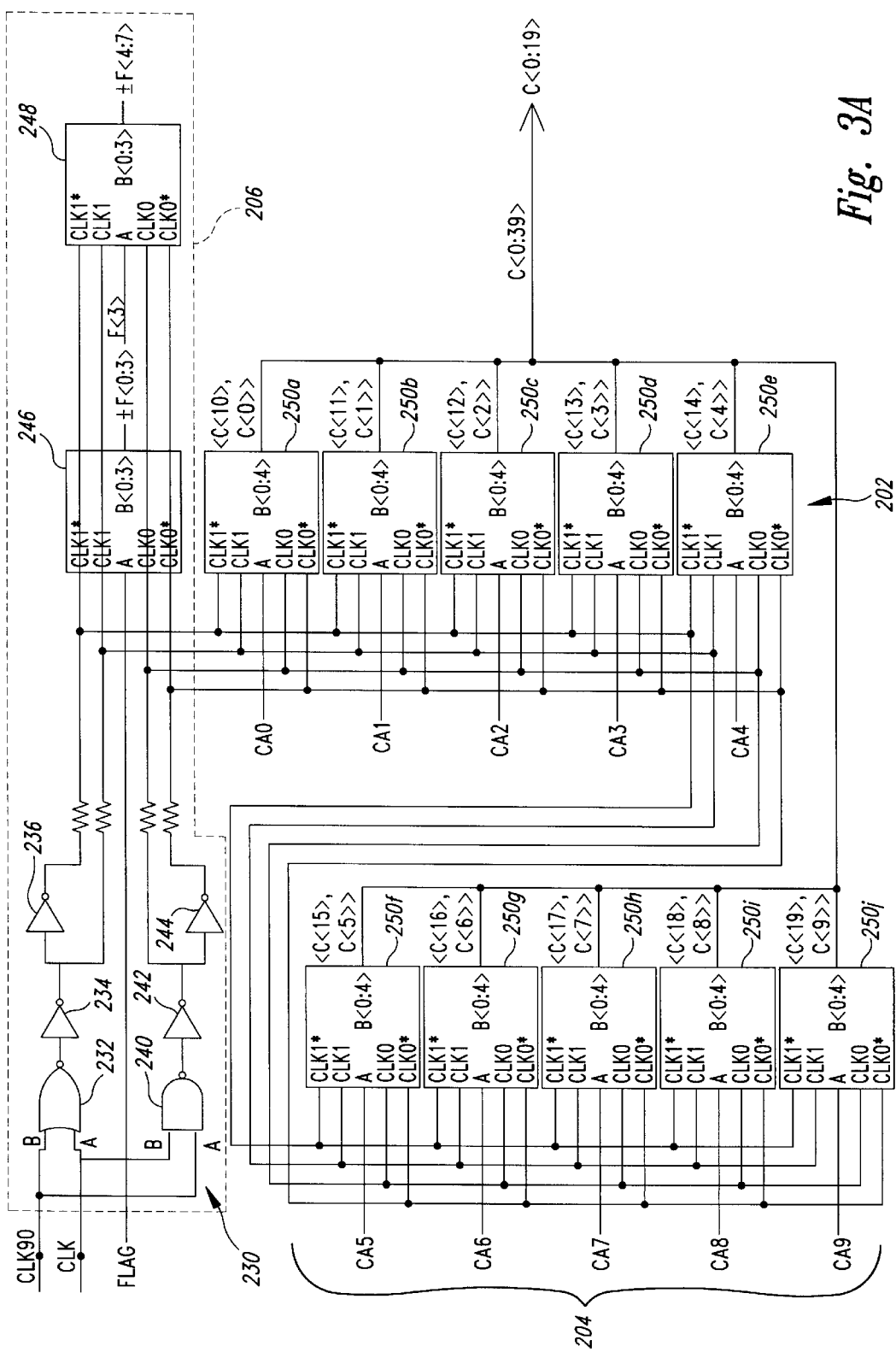
FIG. 3 is a block diagram of a portion of an embodiment of a command decoder and sequencer in accordance with the present invention that are usable in the packetized DRAM of FIG. 2.
Figure 3B:
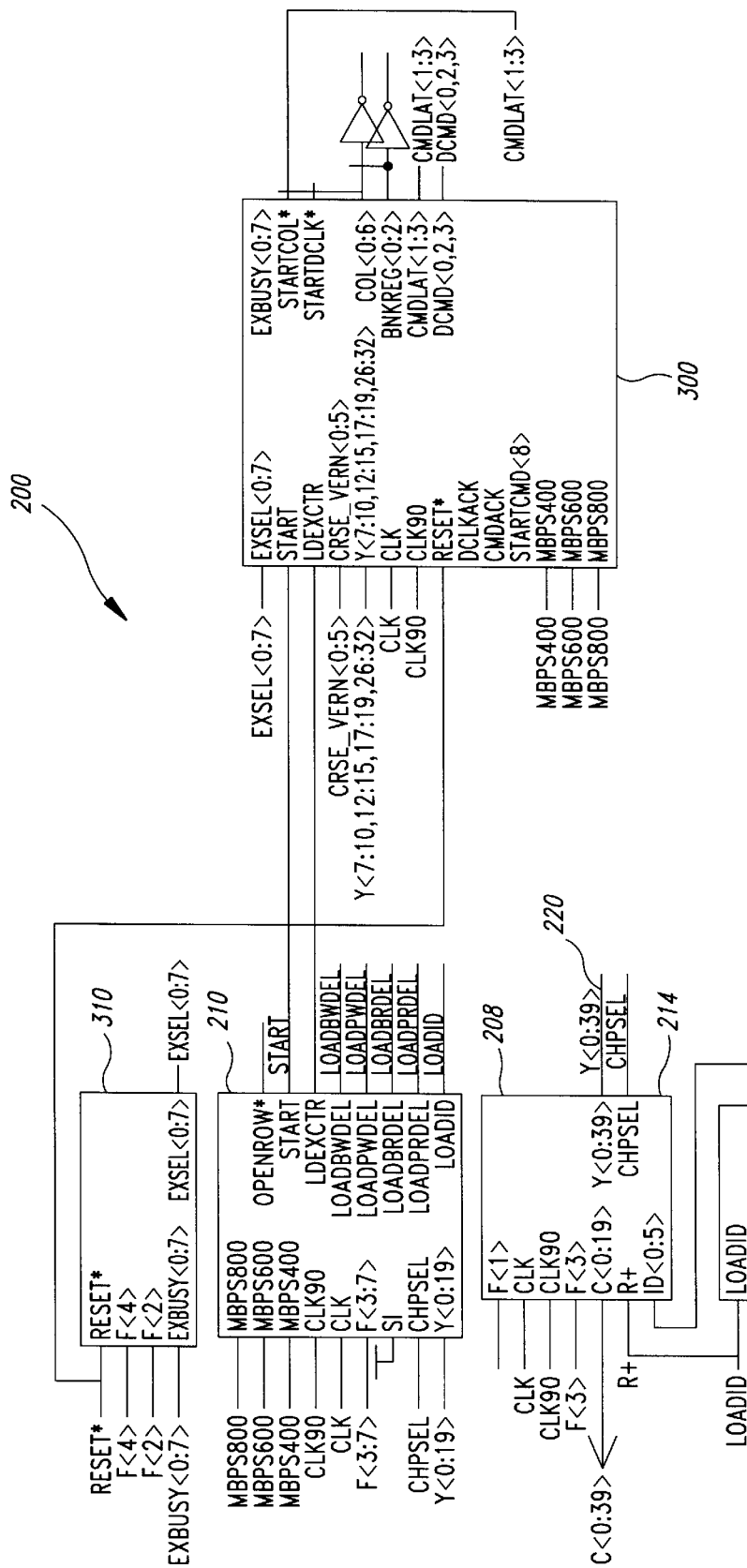

One embodiment of a command decoder and sequencer 200 in accordance with the present invention that is usable in the packetized DRAM 16 of FIG. 2 is shown in FIG. 3. The command decoder and sequencer 200 is shown with the command buffer 46 coupling command packets to the command decoder and sequencer 200. The command decoder and sequencer 200 can be used in place of the command decoder and sequencer 60 in FIG. 2, and the resulting memory device may be used in the computer system shown in FIG. 1.

With reference to FIG. 3, a command packet consisting of a plurality of packet words are applied to a shift register 202 via a command bus 204. The shift register 202 shown in FIG. 3 includes ten separate shift register circuits 250a–j, each of which receive a respective bit CA0–CA9 of the incoming 10-bit packet word. As explained further below, each of the shift register circuits 250a–j includes four shift register stages. The packet words CA of the command packet are shifted from one shift register stage to the next on each transition of a clock signal, i.e., two stages for each clock cycle. Thus, after two clock cycles, four packet word bits CA have been shifted into each shift register circuit 250, and all four of these bits are available as a 4-bit command word B<0:3>. Thus, the ten shift register circuits 250a–j collectively output a 40-bit command word Coincident with the start of a four word command packet, a FLAG signal is applied to a control circuit 206 which is clocked by quadrature clock signals, CLK and CLK90. After four packet words have been shifted into the shift register 202, the control circuit 206 generates an F<3> signal that is applied to a storage register 208. The storage register 208 then loads all of the data stored in the shift register 202. In the embodiment shown in FIG. 3 in which four 10-bit packet words are shifted into the shift register 202, the storage register 208 receives and stores a 40-bit command word. However, in the more general case, the shift register 202 has N stages, each of which has a width of M bits, and the storage register 208 loads an M*N-bit command word.

The storage register 208 shown in FIG. 3 stores all of the packet words in a command packet after all four of the packet words have been shifted into the shift register 202. However, it will be understood that packet words shifted into a shift register may be transferred to one or more storage registers before all of the packet words of a command packet have been shifted into the shift register. For example, where each command packet contains 4 packet words, the packet words may be transferred to one of two storage registers after only 2 packet words have been shifted into the shift register 202. After the remaining 2 packet words have been shifted into the shift register 202, they can be transferred to either the same storage register or a second storage register (not shown) so that each of 2 storage registers stores respective sets of 2 packet words. Together, the two storage registers would then output a 40-bit command word in the same manner as the storage register 208 in FIG. 3.

After the storage register 208 has been loaded with the 40-bit command word, it continuously outputs the 40-bit command word Y<0:39> corresponding to the 4 packet words on a command bus 220. All or part of the 40 bits command word Y<0:39> is applied to a decoder 210, an ID register 212, and a compare circuit 214 (the storage register 208 and the compare circuit 214 are shown as one block in FIG. 3). The compare circuit 214 generates an active high CHPSEL signal on line 222 which causes the memory device to perform a function corresponding to the command word Y<0:39>.

The function of the decoder 210, ID register 212, and compare circuit 214 is to examine a portion of the 40-bit command word and determine whether the command word is intended for the memory device containing the ID register 212. More specifically, the ID register 212 is programmed with a unique identifying code included in an initialization packet during an initialization routine. A portion of the 40 bits of the initialization packet output from the storage register 208 is applied to the decoder 210, and another portion is applied to the ID register 212. The portion of the initialization packet applied to the decoder 210 is recognized by the decoder 210, which then generates a latch signal which causes the ID register 212 to store another portion of the initialization packet. The portion of the initialization packet stored in the ID register 212 uniquely identifies the memory device containing the ID register 212. Thus, the portion of the command word decoded by the decoder 210 is the same for all memory devices, while the portion of the command word applied to the ID register 212 is different for each memory device. (During the initialization, means are provided to prevent all of the memory devices from simultaneously responding to the initialization packet, as explained below.) Thus, after initialization, the ID register 212 contains identifying data that is unique to the memory device containing the ID register 212.

After the identifying data have been stored in the ID register 212, a portion of each 40-bit command word from the storage register 208 is applied to the comparator 214, and the comparator 214 compares the portion of the command word to the identifying data stored in the ID register 212. In the event of a match, the comparator 214 generates an active CHPSEL signal that causes the memory device to carry out the operation corresponding to the command word on the command bus 220. Significantly, when the memory device is carrying out that operation, the next four packet words are being shifted into the shift register 202. Thus, the memory device 16 is capable of continuously receiving and processing packet words.

With further reference to FIG. 3, the control circuit 206 includes a clock circuit 230 receiving a clock signal CLK and its quadrature CLK90 from elsewhere in the memory device 16. The CLK and CLK90 signals are applied to a NOR gate 232 which outputs a high whenever CLK and CLK90 are both low. The output of the NOR gate 232 will transition low on the rising edge of each CLK signal. The output of the NOR gate 232 is applied through a first inverter 234 to generate a CLK1 signal and then through a second inverter 236 to generate a CLK1* signal (the "*" symbol after a signal name is used throughout to designate the compliment of the signal).

The CLK90 and CLK signals are also applied to a NAND gate 240 which outputs a low whenever both CLK and CLK90 are high. The output of the NAND gate 240 will transition high on the falling edge of each CLK signal. The output of the NAND gate 240 is coupled through an inverter 242 to generate a CLK0 signal and then through a second inverter 244 to generate a CLK0* signal.

Since the output of the NOR gate 232 will transition low on the rising edge of each CLK signal and the output of the NAND gate 240 will transition high on the falling edge of each CLK signal, there is a transition available on both transitions of the CLK signal. The CLK and CLK90 signals, and their compliments CLK* and CLK90* are used by the shift register 202 to shift each packet word CA one shift register stage on each transition of the CLK signal, i.e., two shift register stages for each period of the CLK signal. These signals are also used throughout the command buffer 46 and command decoder and sequencer 200, as explained in detail below.

The control circuit 206 also includes a pair of shift register circuits 246, 248 that are connected in series with each other to form an 8-stage shift register. The shift register circuit 246 receives the FLAG signal and sequentially shifts it through the four stages of the shift register circuit 246 and then through the four stages of the shift register circuit 248 responsive to the CLK0, CLK0*, CLK1, and CLK1* signals. The FLAG signal is shifted through two stages of the shift register circuits 246, 248 each cycle of the CLK signal. Thus, when FLAG goes high, two successive F<0:7> outputs of the shift register circuits 246, 248 sequentially go high each clock cycle.

As mentioned above, some means must be provided to prevent multiple memory devices 16a–c in the same computer system from responding to the same initialization packet. This is accomplished by the storage register 210 and the ID register 212 using the SI input of the storage register 210, the reset inputs, R* and RESET*, to the storage register 210 and the ID register 212, respectively, and the S0 output of the ID register 214. All of these signals are used during the initialization sequence. Specifically, at initialization, the RESET* input goes active low to load predetermined identification data, i.e., the number "63," into the ID register 212. The RESET* signal also clears all 40 stages of the storage register 208 so that a spurious command word does not appear on the command bus 220. By setting the identification data in the ID register 212 to a known value, i.e., 63, the processor is able to subsequently load the ID register 212 with identifying data that is unique to the memory device containing the command buffer 200. As mentioned above, the comparator 214 must generate a CHPSEL signal to allow the memory device to perform various functions. Included in these various functions is decoding the portion of the 40-bit command word that allows the decoder 210 to generate the LOADID signal. Thus, if the processor was not able to apply to the command buffer 200 a command packet containing the identifying data in the ID register 212, the comparator 214 would not generate the CHPSEL output. Without the CHPSEL output, the decoder 210 would not generate the LOADID output to load the identifying data into the ID register 212. However, the command packet initially contains the binary equivalent of 63 which is favorably compared by the comparator 214 to the "63" initial identifying data in the ID register 212. Thus, on this initialization command, the comparator 214 generates the CHPSEL signal which allows the decoder 210 to generate a LOADID signal that latches other portions of the 40-bit command word into the ID register 212 as the unique identifying data for the memory circuit containing the command buffer 200.

During the initialization routine, all of the memory devices in the computer system 10 (FIG. 1) receive the same command packet and thus would latch the same identifying data into their respective ID registers 212 if there were not some means to prevent all of the memory devices from simultaneously responding to the initialization command packet. The SI input and the SO output are provided for this purpose. Assuming that the computer system 10 contains three memory devices 16, the SI input of the first memory device is permanently held high through a jumper or similar means. A high SI input allows the command decoder 210 to generate a LOADID output to load a portion of the 40-bit command word into the ID register 212 as the unique identifying data. The SO output of the first memory device is coupled to the SI input of the second memory device, and the SO output of the second memory device is coupled to the SI input of the third memory device. The SO output of each of the memory devices is initially low. However, when unique identifying data is loaded into the ID register 212, the ID register 212 generates a high SO output. The high SO output coupled to the SI input of the subsequent memory device allows the subsequent memory device to be programmed with the identifying data. Thus, after the identifying data has been loaded into the ID register 212 for the first memory device, its SO output goes high thereby driving the SI input of the second memory device high. As a result, the identifying data in the initialization command packet is loaded into the ID register 212 of the second memory device which then generates a high SO output. The high SO output drives the SI input of the third memory device high which allows the ID register 212 of the third memory device to receive and store identifying data in the third initialization command packet. Once the unique identifying data has been stored in the ID register 212, the memory device no longer responds to the initialization command packet because the identifying data is no longer "63," which is the identifying data in the initialization command packet.

Figure 4A:
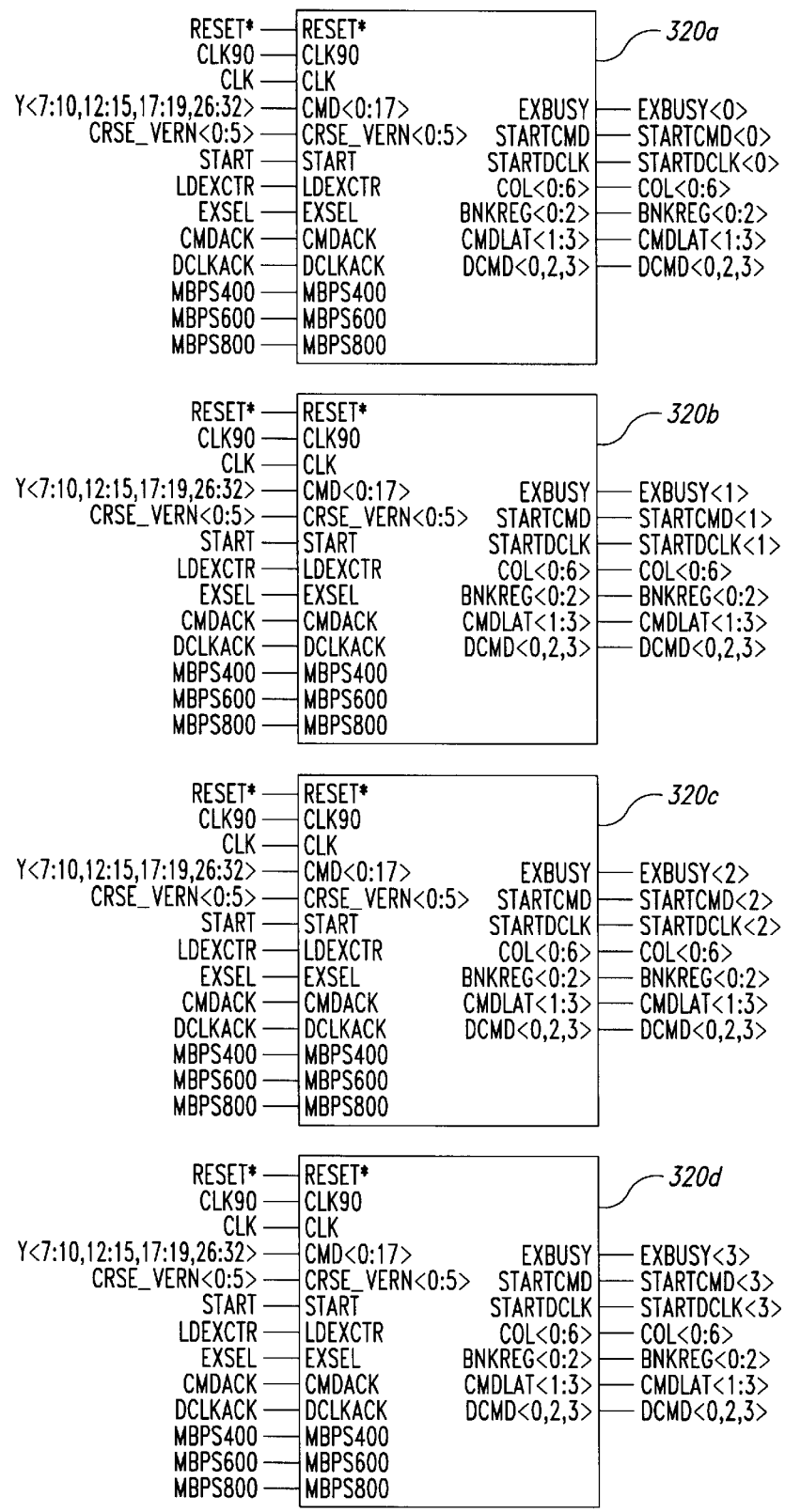
FIG. 4 is a block diagram of the command pipeline used in the command decoder and sequencer of FIG. 3.
Figure 4B:
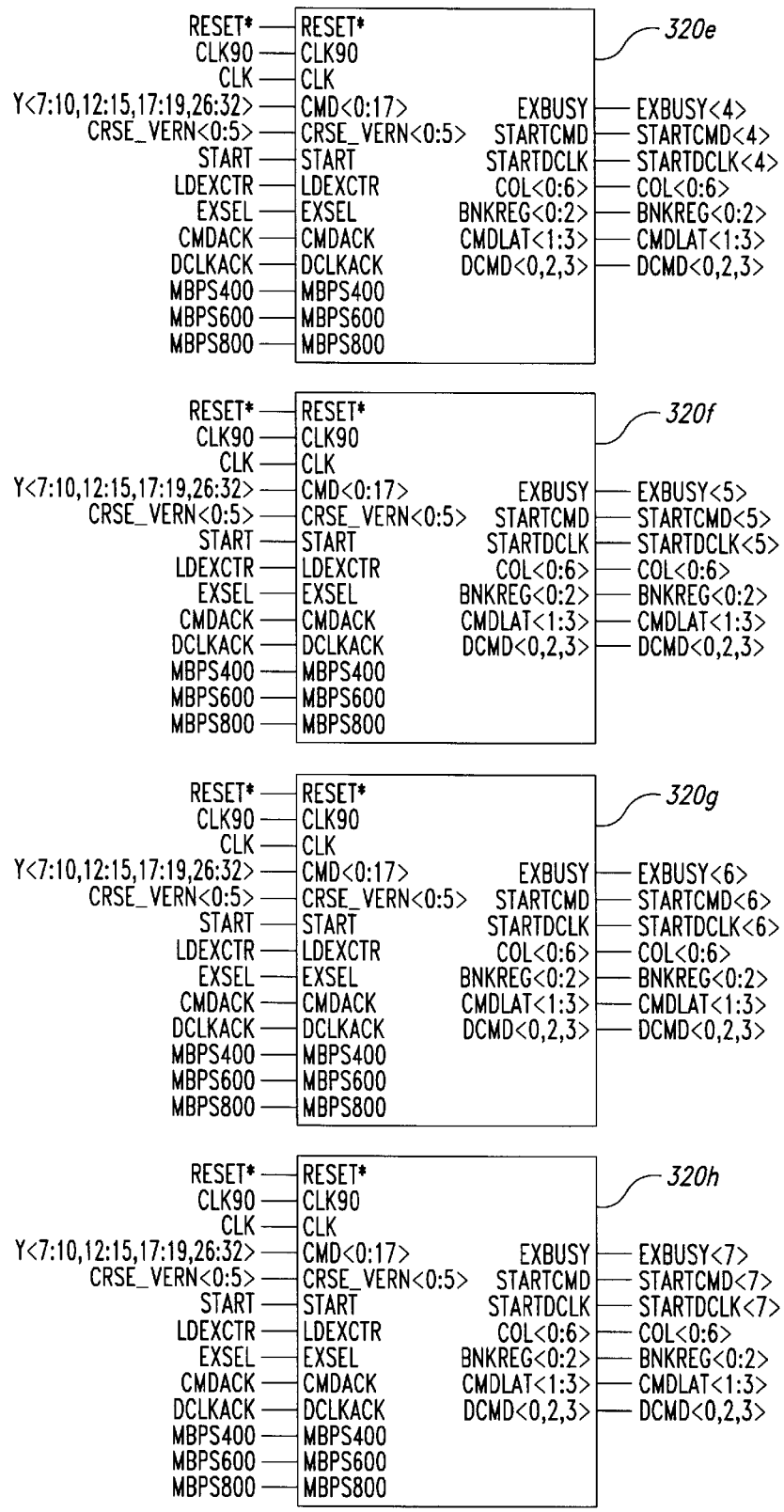

The command sequencer and decoder 200 also includes a command hold pipeline 300 and a pipeline control circuit 310. With reference, also, to FIG. 4, the command hold pipeline 300 includes a plurality of command units 320a–h each of which is capable of storing predetermined portions of the command word Y<0:39> from the storage register 208. The command words may be stored in the command units 320 at a faster rate than the memory device 16 is able to process them. The stored command words are used to generated a sequence of command signals that cause corresponding functions to be performed in the memory device. The use of multiple command units 320, each of which stores a respective command word, provides significant advantages to increase the speed of the memory device 16. By using multiple command units 320, the memory device 16 can continue to receive command packets even though the prior command packet has not yet been processed. In fact, the command packets can be received as long as the average rate at which the command packets are received is less than the average time to process the command packets and complete memory transfer operations. As a result, memory devices using the command sequencer and decoder 200 of FIGS. 3 and 4 are able to operate at a relatively high speed.

The pipeline control circuit 310 controls the storing of command words in each of the command units 320 in a manner that prevents a single command word from being stored in more than one command unit 320. The pipeline control circuit 310 also prevents a command word from overwriting a command word previously stored in a command unit 320 before the command unit has generated corresponding command signals from the stored command word. Basically, each command unit 320 generates a respective active high BUSY signal when a command word has been stored in the command unit 320. After command signals have been generated from the stored command word, an active low CNTHALT* signals terminates the BUSY signal so that command words may once again be stored in the command unit 320.

The pipeline control circuit 310 controls which of the command units 320 store a command word output from the storage register 208 by issuing an active high EXSEL signal to one and only one of the command units 320 at a time. The command unit 320 receiving the EXCEL signal then stores the command word. The pipeline control circuit 310 determines which command unit should receive the EXSEL signal by examining the BUSY signals from all of the command units 320. The pipeline control circuit 320 arranges the command units 320 in a hierarchy from the first command unit 320 to store a command word (i.e., none of the command units have yet stored a command word) to the last command unit 320 to store a command word (i.e., all of the other command units have already stored a command word). The pipeline control circuit 320 issues an active high EXSEL signal to a command word only if its BUSY signal is active low and the respective BUSY signals for all command units 320 higher in the hierarchy are active high.

As explained in greater detail below, a course veneer circuit 330 generates a 6-bit course veneer word CRSE_VERN<0:5> from a portion of the command word Y<9, 11, 20–24>. The course veneer word CRSE_VERN<0:5>is used to preload a counter in each of the command units 320. The command units then generate command signals corresponding to respective counts of the counter.

Figure 5:
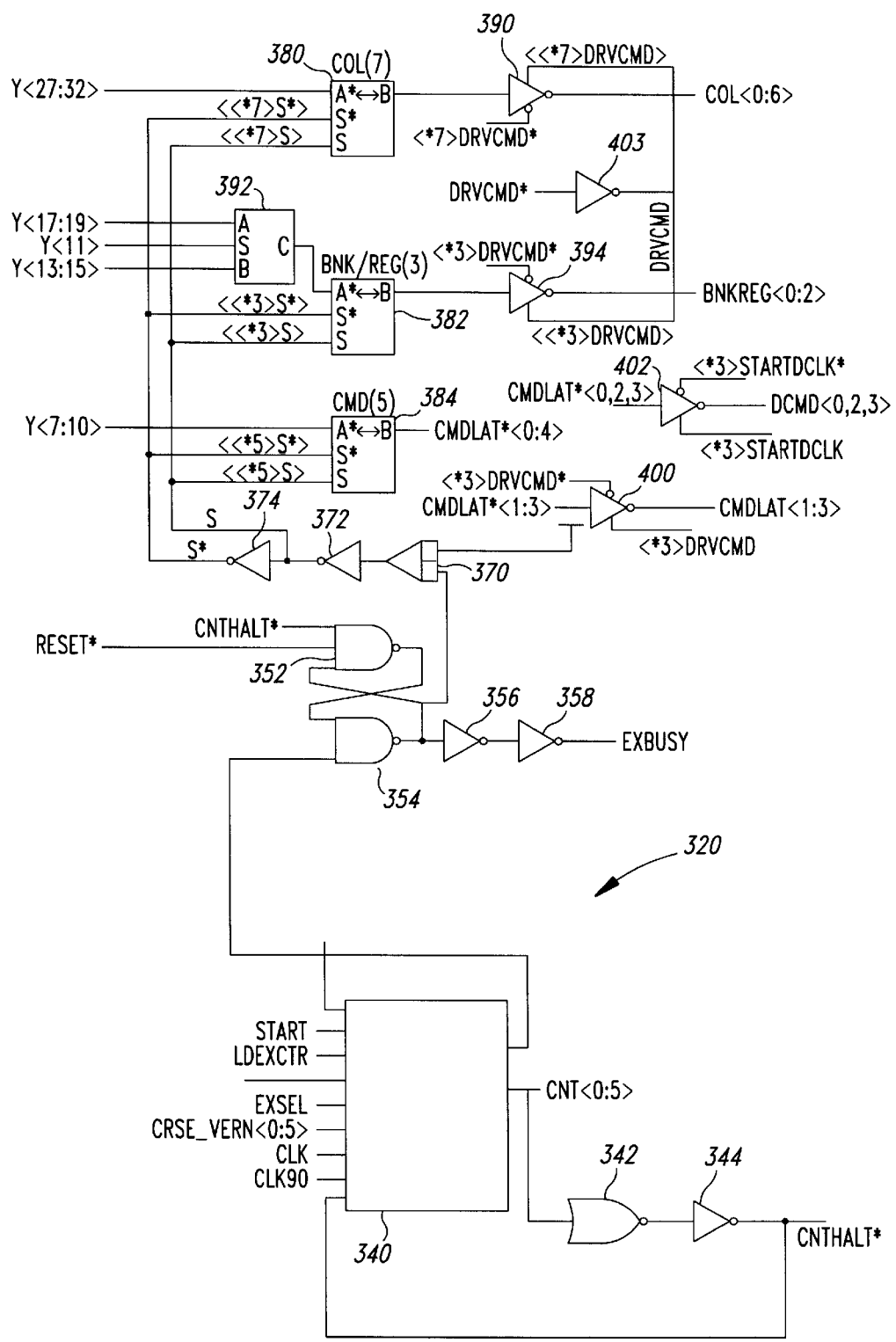
FIG. 5 is a logic and block diagram of one of several command units which are used in the command pipeline of FIG. 4.

The command units 320 are illustrated in greater detail in FIG. 5. As mentioned above, each of the command units include a counter 340 that is preloaded with the CRSE_VERN<0:5> word responsive to an LDXCTR signal generated by another portion of the memory device 16. The counter 340 also receives a START signal which is generated by the decoder 210 from the F<3> output of the shift register circuit 246. The START signal causes the counter 340 to begin decrementing. However, it will also be understood that the counter 340 alternatively can be an incrementing counter. The counter 340 is able to decrement responsive to the CLK and CLK90 signals only if its EXSEL input is high. Whenever the counter 340 starts decrementing, the counter 340 generates a short, active low START_EN* signal. The output of the counter is a 6-bit word CNT<0:5>. The zero terminal count of counter is decoded by a NOR gate 342, and the output of the NOR gate 342 is inverted by an inverter 344 to generate an active low CNTHALT* signal when the terminal count of the counter 340 is reached. The CNTHALT* signal causes the counter 340 to stop decrementing and performs other functions as explained below. The CNT<0:5> output of the counter 340 is decoded to generate various command signals by other portions of the memory device.

Each of the command units 320 also includes a busy control circuit 350 which includes a pair of NAND gates 352, 354 connected to form a flip-flop. The output of the NAND gate 354 is coupled through two inverters 356, 358 to generate the EXBUSY signal at the output of the inverter 358. The flip-flop formed by the NAND gates 352, 354 is set to generate the active high EXBUSY signal by the START_EN* pulse when the counter 340 starts decrementing. Thus, when the counter 340 is decrementing, the active high EXBUSY signal indicates that the counter 340 is busy decrementing. The flip-flop formed by the NAND gates 352, 354 is reset at power on by an active low RESET* signal. The flip-flop formed by the NAND gates 352, 354 is also reset by the active low CNTHALT* signal generated when the zero terminal count of the counter 340 is reached. As mentioned above, the CNTHALT* signal prevents the counter 340 from decrementing further, and this CNTHALT* signal also terminates the EXBUSY signal to indicate that the counters 340 is no longer busy decrementing.

When the flip-flop formed by the NAND gates 352, 354 is set, the output of the NAND gate 354 triggers a pulse generator 370 which is inverted by a pair of inverters 372, 374 to latch signals applied to various latches 380, 382, 384. The latch 380 stores command word bits Y<27:32> which, after being coupled through a tri-state inverter 390, comprises a column address COL<0:6>. Similarly, the latch 382 stores a bank or register address received from a multiplexer 392 which, after being inverted by a tri-state inverter 394, is output as a bank address BNKREG<0:2>. The bank address is Y<13:15>, and it is used to select one of the memory banks for a memory access. The register address is Y<17:19>, and it is used to select one of several locations in an internal register to which memory configuration data can be written. The multiplexer 392 selects either the bank address Y<13:15> or the register address Y<17:19> for coupling to the tri-state inverter 394 responsive to the command word bit Y<11>. Finally, the command word bits Y<7:11> are stored in the latch 384 to generate a latched command word CMDLAT*<0:4>. Bits 1–3 are CMDLAT<0:4> are applied to a tri-state inverter 400 as CMDLAT*<1:3> to generate a CMDLAT<1:3> output. Similarly, CMDLAT* bits <0, 2, 3> are applied to a tri-state inverter 402 to generate a DCMD<0, 2, 3> output. The tri-state buffers 390, 394, 400 and 402 are switched between their active and high impedance states by control signals that are generated by other portions of the memory device.

Figure 6:
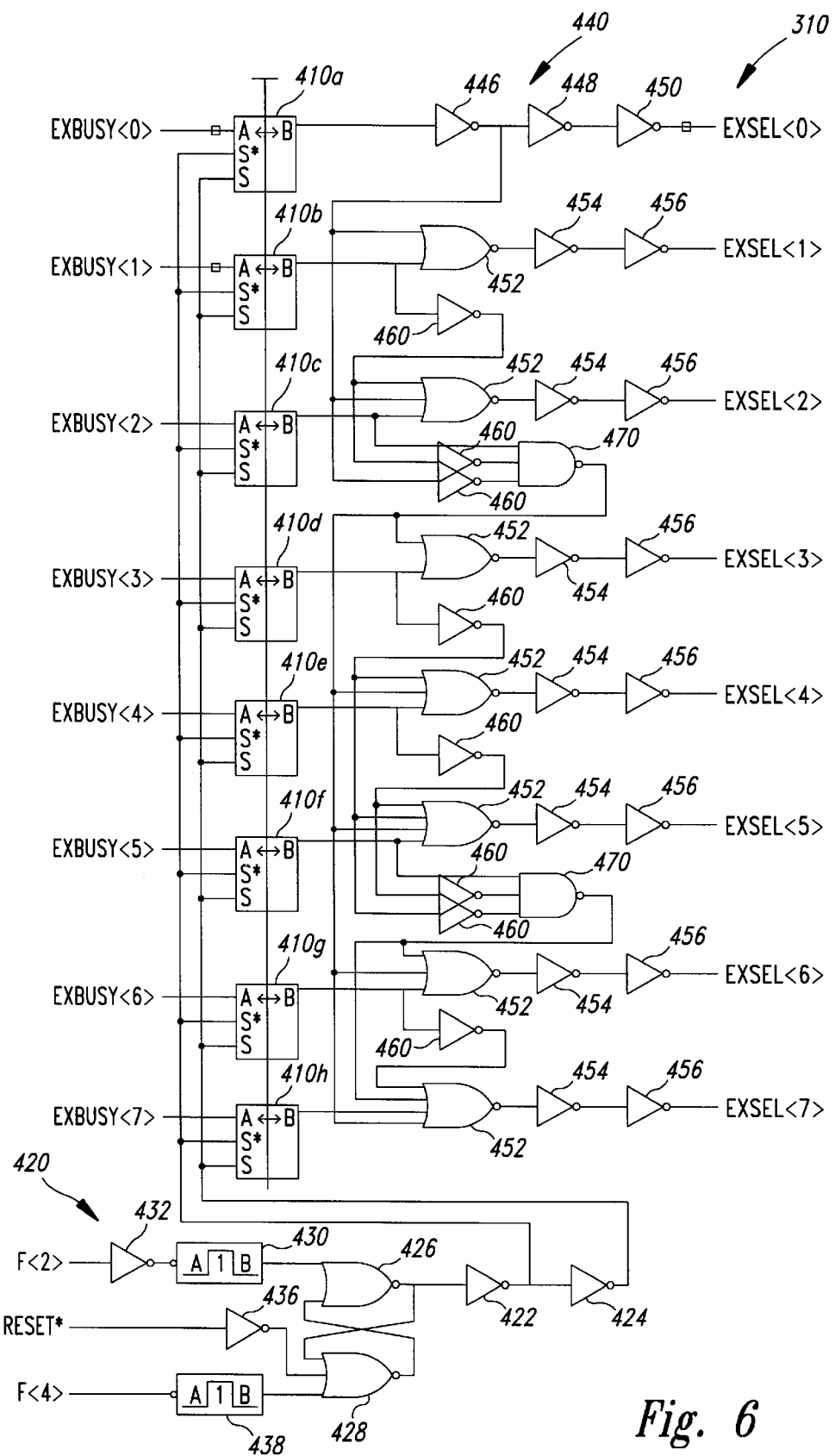
FIG. 6 is a logic diagram of a pipeline control circuit used to control the operation of a counter that is included in each of the command units of FIG. 5.

The pipeline control circuit 310 for controlling the operation of the counters 340 is illustrated in FIG. 6. As explained above, the pipeline control circuit 310 examines respective BUSY signals from each of the command units 320 to generate respective EXSEL signals to control the storing of command words in each of the command units 320. As a result, the pipeline control circuit 310 prevents a single command word from being stored in more than one command unit 320, and it prevents a command word from prematurely overwriting a previously stored command word. As also mentioned above, the pipeline control circuit 310 performs these functions by arranging each of the command units, and their respective BUSY signals, in a hierarchy.

The pipeline control circuit 310 includes a respective latch 410*a–h* for each command unit 320 *a–e* that is operated by a latch control circuit 420. Each of the latches 410 store a respective EXBUSY signal when the output of an inverter 422 goes high and the output of an inverter 424 goes low. This condition will occur whenever a flip-flop formed by NOR gates 426, 428 is set by a pulse generated by a pulse generator 430. The pulse generator 430 is triggered by a negative going transition at the output of an inverter 432 which receives the F<2> signal at its input. The F<2> signal is generated by the shift register circuit 246 (FIG. 3) on the third CLK signal transition after the FLAG signal is received by the shift register circuit 246. Thus, when the F<2> signal is generated, the EXBUSY signals are stored in their respective latches 410. The flip-flop formed by the NOR gates 426, 428 is reset by either the negative going power-on reset signal RESET* coupled through an inverter 436 or a pulse from pulse generator 438 which occurs responsive to the F<4> signal one clock period after the F<2> signal.

The remainder of the pipeline control circuit 310 comprises a logic circuit 440 which arranges the EXBUSY signals from respective command units 320 in a hierarchy as explained above. The EXBUSY<0> signal has the highest hierarchy while the EXBUSY<7> signal has the lowest hierarchy. In other words, the command unit 320 receiving the EXSEL<0> signal will store a command word before any other command unit 320, and the command unit receiving the EXSEL<7> signal will not store a command word until all of the other command units 320 have stored a command word. The logic circuit 440 generating the EXSEL<0> output includes three inverters 446, 448, 450. The logic circuit 440 generating all other EXSEL signals includes a NOR gate 452 and a pair of inverters 454, 456. Inverters 460 couple the output of respective latch circuit 410 to NOR gates 452 having a lower hierarchy for reasons that will be explained below.

It will be apparent from FIG. 6 that the active high EXSEL<0> signal is generated whenever an inactive low EXBUSY<0> signal is stored in the latch 410*a*. Thus, as long as the command unit 320*a* generating the EXBUSY<0> signal is not busy counting, a high EXSEL<0> signal will be generated to cause the command unit 320*a* to store a command word. The output of the inverter 446 is coupled to the NOR gates 452 to prevent EXSEL<1:7> signals from being active even if their respective busy input signals EXBUSY<1:7> are inactive low. More specifically, a low EXBUSY<0> signal at the output of the latch 410*a* will cause the output of the inverter 446 to be high. The high at the output of the inverter 446 will disable the NOR gates 452 to which it is coupled, thereby preventing the EXSEL<1:2> signals from going high. The output of the inverter 446 is coupled through an inverter 460 to a NAND gate 470 so that the high at the output of the inverter 446 will cause the NAND gate 470 to output a high. The high at the output of the NAND gate 470 disables the remaining NOR gates 452 for the EXSEL<3:7> signals. Thus, whenever the EXBUSY<0> signal is low, an active high EXSEL<0> signal is generated, and the EXSEL<1:7> signals are forced inactive low.

If the EXBUSY<0> signal is active high, then the inverter 446 outputs a low. The low at the output of the inverter 446 enables all of the NOR gates 452, either directly or through the NAND gate 470. However, an active high EXSEL<N> signal can be generated responsive to an inactive low EXBUSY<N> signal only if the EXBUSY<N+1> signals that are higher in the hierarchy are active high. For example, if the EXBUSY<4> signal is inactive low, an active high EXSEL<4> signal will be generated only if the NAND gate 452 generating the EXBUSY<4> signal is enabled. The NAND gate 452 will be enabled only if the latched EXBUSY<3> signal is active high and the output of the NAND gate 470 is low responsive to the EXBUSY<0:2> signals being active high. If an EXSEL<4> signal is generated from the inactive low EXBUSY<4> signal, then the high at the output of its latch 410*e* is coupled through the inverter 460 to disable all of the NAND gates 452 having a lower hierarchy. In this manner, the pipeline control circuit 310 ensures that each command word is stored in one and only one command unit 320 and that a command word does not overwrite a stored command until its respective EXBUSY signal goes inactive low. As mentioned above, the EXBUSY signal for a command unit 320 goes inactive low responsive to the CNTHALT* signal when the counter 340 has decremented to the terminal count.

The looping nature of the EXBUSY and EXSEL signals (i.e., the EXSEL signal controls the EXBUSY signal, and the EXBUSY signal controls the EXSEL signal, etc.) makes it important to control the time at which the EXSEL signals are generated. Basically, the timing circuit 420 freezes the status of the EXBUSY signals when the F<2> signal is generated. Shortly after the F<2> signal, one of the EXSEL outputs from the pipeline control circuit 310 will go active high to enable a counter 340. As explained above, on the next transition of the CLK signal at F<3>, the START signal is generated to cause the counter 340 to begin decrementing. One-half of a clock period after the counter 340 in one of the command units 320 has begun decrementing, the F<4> signal unfreezes the latches 420 by resetting the flip-flop formed by the NOR gates 426, 428. As a result, race conditions in which the transient nature of the signals cause two command units 320 to store the same command word or cause a command word to overwrite another command word are prevented.

As mentioned above, the command sequencer and decoder 200 shown in FIGS. 3–6 may be used in place of the command sequencer and decoder 60 in the packetized DRAM 16 that is shown in FIG. 2. The resulting memory device 16 may be used in the computer system shown in FIG. 1 to provide superior operating speed. While the invention has been described herein by way of exemplary embodiments, various modifications may be made without departing from the spirit and scope of the invention. Accordingly, the invention is not limited except as by the appended claims.

What is claimed is:

1. A system for receiving a plurality of command packets, each of which contain at least one packet word, and generating from the packet word in each command packet at least one corresponding command signal, the system comprising:

a command buffer receiving and storing at least a portion of at least one packet word in each packet, the command buffer applying the stored portion of each command packet to a command bus;

a plurality of command units coupled to the command bus of the command buffer, each of the command units storing at least a portion of a packet word received from the command buffer responsive to a respective select signal, each of the command units generating a respective busy signal indicating that a portion of a packet word has been stored in the command unit, the command unit generating on a respective output terminal the command signal corresponding to the stored portion of the packet word; and a control circuit receiving the busy signals from the respective command units to determine which of the command units are storing a portion of a packet word, the control circuit applying a respective select signal to one of the command units from which a busy signal is not being received to cause the command unit receiving the select signal to store the portion of the packet word received from the command buffer.

2. The system of claim 1 wherein each of the command units stores at least one entire packet word received from the command buffer responsive to its respective select signal.

3. The system of claim 1 wherein each of the command units stores at least portions of a plurality of the packet words in a respective command packet responsive to its respective select signal.

4. The system of claim 1 wherein each of the command units includes a respective counter that is loaded with a count determined by the stored portion of the respective packet word, the counter incrementing or decrementing responsive to the respective select signal, and wherein each of the command units generates a plurality of command signals responsive to respective counts of the counter.

5. The system of claim 1 wherein each of the command units further generates a respective command complete signal after the command signal has been asserted at the output terminal of the respective command unit, and wherein the command signal terminates the busy signal generated when the portion of the packet word was stored in the command unit.

6. The system of claim 5 wherein each of the command units includes a respective counter that is loaded with a count determined by the stored portion of the respective packet word, the counter incrementing or decrementing responsive to the respective select signal, and wherein each of the command units further includes a decoder for detecting a predetermined count of the counter and generating the respective command complete signal in response thereto.

7. The system of claim 1 wherein the control circuit comprises:

a plurality of latches corresponding in number to the number of command units in the system, each of the latches receiving a busy signal from a respective command unit, storing the received busy signal responsive to a latch signal, and outputting the stored busy signal on an output terminal;

a plurality of logic circuits coupled to the output terminals of respective latches, the logic circuits and latches to which they are coupled being assigned a predetermined hierarchy, each of the logic circuit generating a select signal that is applied to a respective command unit responsive to the absence of a stored busy signal at the output terminal of the respective latch and the presence of a stored busy signal at the output terminal of latches that are lower in the hierarchy; and a timing circuit generating the respective latch signals for each of the latches.

8. The system of claim 7 wherein the command units generate their respective command signals after storing a portion of a packet word responsive to a trigger signal, and wherein the timing circuit generates the trigger signal after generating the latch signal.

9. The system of claim 7 wherein the command units generate their respective busy signals after storing a portion of a respective packet word responsive to a respective trigger signal, and wherein the timing circuit generates each of the trigger signals after generating the respective latch signal.

10. The system of claim 7 wherein each of the command units generates a respective busy signal responsive to receiving a respective select signal.

11. A system for sequentially receiving a plurality of command packets, each of which contains at least one packet word, and generating from the packet words at least one corresponding command signal, the system comprising:

buffer means for receiving the packet word for each packet and storing at least a portion of the packet word, the buffer means applying the stored portion of the packet word to a command bus;

command means coupled to the command bus of the buffer means, the command means storing at least a portion of a plurality of packet words from a respective plurality of command packets received from the buffer means, the portion of each of the packet words being stored responsive to a respective select signal, the command means generating a plurality of busy signals indicating that the portion of a respective packet word has been stored in the command means, the command means generating on an output terminal at least one command signal corresponding to the stored portion of the respective packet word; and control means receiving the busy signals from the command means to determine which packet words are stored in the command means, the control means applying a respective select signal to the command means when a portion of a corresponding packet word has been stored in the command means.

12. The system of claim 11 wherein the command means stores at least one entire packet word received from the buffer means responsive to its respective select signal.

13. The system of claim 11 wherein the command means stores at least portions of a plurality of the packet words in a respective command packet responsive to its respective select signal.

14. The system of claim 11 wherein the command means includes counter means that are loaded with respective counts that are determined by the stored portion of the respective packet words, the counter means incrementing or decrementing responsive to the respective select signal, and wherein the command means generates a plurality of command signals responsive to respective counts of the counter means.

15. The system of claim 11 wherein the command means further generates a plurality of command complete signal after respective command signals have been asserted at the output terminal of the command means, and wherein the command complete signals terminate the respective busy signal generated when the portion of the packet word was stored in the command means.

16. The system of claim 15 wherein the command means includes respective counter means that are loaded with respective counts that are determined by the stored portion of the respective packet words, each of the counter means incrementing or decrementing responsive to the respective select signal, and wherein the command means further includes decoder means for detecting a predetermined count of the counter means and generating the respective command complete signal in response thereto.

17. The system of claim 11 wherein the control means comprises:

a plurality of latch means corresponding in number to the maximum number of the packet word portions that may be stored in the command means, each of the latch means receiving a respective busy signal from the command means corresponding to a portion of a respective packet word being stored in the command means, storing the received busy signal responsive to a latch signal, the latch means outputting the stored busy signal on a respective output terminal;

logic means coupled to the output terminals of the plurality of latch means, the latch means to which the logic means are coupled being assigned a predetermined hierarchy, the logic means generating the plurality of select signals that are applied to the command means responsive to the absence of a stored busy signal at the output terminal of the respective latch means and the presence of a stored busy signal at the output terminal of latch means that are lower in the hierarchy; and timing means generating the respective latch signals for each of the latch means.

18. The system of claim 17 wherein the command means generate the command signals after storing a portion of a respective packet word responsive to a respective trigger signal, and wherein the timing means generates the trigger signal after generating the latch signal.

19. The system of claim 17 wherein the command means generate the busy signals after storing a portion of a respective packet word responsive to a respective trigger signal, and wherein the timing means generates the trigger signal after generating the latch signal.

20. The system of claim 17 wherein the command means generates each busy signal responsive to receiving a respective select signal.

21. A memory device reading or writing data responsive to respective command packets each of which include a row address and a column address, the memory device comprising:

a command buffer receiving and storing at least one packet word for each packet, the command buffer applying the packet word to a command bus;

a plurality of command units coupled to the command bus of the command buffer, each of the command units storing at least a portion of the packet word in each packet received from the command buffer responsive to a respective select signal, each of the command units generating a respective busy signal indicating that a portion of a packet word has been stored in the command unit, the command unit generating on respective output busses a command, a row address and a column address corresponding to the stored portion of the packet word;

a control circuit receiving the busy signals from the respective command units to determine which of the command units are storing a portion of a packet word, the control circuit applying a respective select signal to one of the command units from which a busy signal is not being received to cause the command unit receiving the select signal to store the portion of the packet word received from the command buffer;

at least one array of memory cells adapted to store data at a location determined by the row address and a column address;

a row address circuit adapted to receive and decode the row address from one of the command units and select a row of memory cells corresponding to the row address;

a column address circuit adapted to receive or apply data to one of the memory cells in the selected row corresponding to the column address from one of the command units; and a data path circuit adapted to couple data between an external terminal and the column address circuit.

22. The memory device of claim 21 wherein each of the command units stores at least one entire packet word received from the command buffer responsive to its respective select signal.

23. The memory device of claim 21 wherein each of the command units stores at least portions of a plurality of the packet words in a respective command packet responsive to its respective select signal.

24. The memory device of claim 21 wherein each of the command units includes a respective counter that is loaded with a count determined by the stored portion of the respective packet word, the counter incrementing or decrementing responsive to the respective select signal, and wherein each of the command units generate a plurality of command signals responsive to respective counts of the counter.

25. The memory device of claim 21 wherein each of the command units further generates a respective command complete signal after the command signal has been asserted at the output terminal of the respective command unit, and wherein the command signal terminates the busy signal generated when the portion of the packet word was stored in the command unit.

26. The memory device of claim 25 wherein each of the command units includes a respective counter that is loaded with a count determined by the stored portion of the respective packet word, the counter incrementing or decrementing responsive to the respective select signal, and wherein each of the command units further includes a decoder for detecting a predetermined count of the counter and generating the respective command complete signal in response thereto.

27. The memory device of claim 21 wherein the control circuit comprises:

a plurality of latches corresponding in number to the number of command units in the system, each of the latches receiving a busy signal from a respective command unit, storing the received busy signal responsive to a latch signal, and outputting the stored busy signal on an output terminal;

a plurality of logic circuits coupled to the output terminals of respective latches, the logic circuits and latches to which they are coupled being assigned a predetermined hierarchy, each of the logic circuit generating a select signal that is applied to a respective command unit responsive to the absence of a stored busy signal at the output terminal of the respective latch and the presence of a stored busy signal at the output terminal of latches that are lower in the hierarchy; and a timing circuit generating the respective latch signals for each of the latches.

28. The memory device of claim 27 wherein the command units generate their respective command signals after storing a portion of a respective packet word responsive to a respective trigger signal, and wherein the timing circuit generates each of the trigger signals after generating the respective latch signal.

29. The memory device of claim 27 wherein the command units generate their respective busy signals after storing a portion of a respective packet word responsive to a respective trigger signal, and wherein the timing circuit generates each of the trigger signals after generating the respective latch signal.

30. The memory device of claim 27 wherein each of the command units generates a respective busy signal responsive to receiving a respective select signal.

31. A computer system, comprising:
a processor having a processor bus;
an input device coupled to the processor through the processor bus and adapted to allow data to be entered into the computer system;
an output device coupled to the processor through the processor bus adapted to allow data to be output from the computer system; and
a memory device coupled to the processor through the processor bus, the memory device reading or writing data responsive to respective command packets each of which include a row address and a column address, the memory device comprising:
a command buffer receiving and storing at least one packet word for each packet, the command buffer applying the packet word to a command bus;
a plurality of command units coupled to the command bus of the command buffer, each of the command units storing at least a portion of the packet word in each packet received from the command buffer responsive to a respective select signal, each of the command units generating a respective busy signal indicating that a portion of a packet word has been stored in the command unit, the command unit generating on respective output busses a command, a row address and a column address corresponding to the stored portion of the packet word;
a control circuit receiving the busy signals from the respective command units to determine which of the command units are storing a portion of a packet word, the control circuit applying a respective select signal to one of the command units from which a busy signal is not being received to cause the command unit receiving the select signal to store the portion of the packet word received from the command buffer;
at least one array of memory cells adapted to store data at a location determined by the row address and a column address;
a row address circuit adapted to receive and decode the row address from one of the command units and select a row of memory cells corresponding to the row address;
a column address circuit adapted to receive or apply data to one of the memory cells in the selected row corresponding to the column address from one of the command units; and
a data path circuit adapted to couple data between an external terminal and the column address circuit.

32. The computer system of claim 31 wherein each of the command units stores at least one entire packet word received from the command buffer responsive to its respective select signal.

33. The computer system of claim 31 wherein each of the command units stores at least portions of a plurality of the packet words in a respective command packet responsive to its respective select signal.

34. The computer system of claim 31 wherein each of the command units includes a respective counter that is loaded with a count determined by the stored portion of the respective packet word, the counter incrementing or decrementing responsive to the respective select signal, and wherein the command unit generates a plurality of command signals responsive to respective counts of the counter.

35. The computer system of claim 31 wherein each of the command units further generates a respective command complete signal after the command signal has been asserted at the output terminal of the respective command unit, and wherein the command signal terminates the busy signal generated when the portion of the packet word was stored in the command unit.

36. The computer system of claim 35 wherein each of the command units includes a respective counter that is loaded with a count determined by the stored portion of the respective packet word, the counter incrementing or decrementing responsive to the respective select signal, and wherein each of the command units further includes a decoder for detecting a predetermined count of the counter and generating the respective command complete signal in response thereto.

37. The computer system of claim 31 wherein the control circuit comprises:
a plurality of latches corresponding in number to the number of command units in the system, each of the latches receiving a busy signal from a respective command unit, storing the received busy signal responsive to a latch signal, and outputting the stored busy signal on an output terminal;
a plurality of logic circuits coupled to the output terminals of respective latches, the logic circuits and latches to which they are coupled being assigned a predetermined hierarchy, each of the logic circuit generating a select signal that is applied to a respective command unit responsive to the absence of a stored busy signal at the output terminal of the respective latch and the presence of a stored busy signal at the output terminal of latches that are lower in the hierarchy; and
a timing circuit generating the respective latch signals for each of the latches.

38. The computer system of claim 37 wherein the command units generate their respective command signals after storing a portion of a respective packet word responsive to a respective trigger signal, and wherein the timing circuit generates the trigger signal after generating the latch signal.

39. The computer system of claim 37 wherein the command units generate their respective busy signals after storing a portion of a respective packet word responsive to a respective trigger signal, and wherein the timing circuit generates each of the trigger signals after generating the respective latch signal.

40. The computer system of claim 37 wherein each of the command units generates a respective busy signal responsive to receiving a respective select signal.

41. A method of generating a plurality of command signals each of which corresponds to at least a portion of at least one packet word in a respective command packet, comprising:
simultaneously storing at least a portion of a packet word from a plurality of respective command packets, the portion of each packet word being stored responsive to a respective select signal;
generating busy signals indicating that portions of respective packet words have been stored;
sequentially generating on an output terminal the command signals corresponding to the stored portions of the respective packet words; and
terminating the busy signal for each stored portion of a respective packet word after the command signal corresponding to the stored portion of the respective packet word has been generated.

42. A method of generating a plurality of command signals each of which corresponds to at least a portion of at least one packet word in a respective command packet, comprising:

simultaneously storing at least a portion of a packet word from a plurality of respective command packets by sequentially storing at least one entire packet word of a respective command packet responsive to a respective select signal, the portion of each packet word being stored responsive to the respective select signal;

generating busy signals indicating that portions of respective packet words have been stored; and sequentially generating on an output terminal the command signals corresponding to the stored portions of the respective packet words.

43. A method of generating a plurality of command signals each of which corresponds to at least a portion of at least one packet word in a respective command packet, comprising:

simultaneously storing at least a portion of a packet word from a plurality of respective command packets, the portion of each packet word being stored responsive to a respective select signal;

generating busy signals indicating that portions of respective packet words have been stored;

sequentially generating on an output terminal the command signals corresponding to the stored portions of the respective packet words; and generating a command complete signal after a command signal corresponding to the stored portion of each respective packet word has been generated, and terminating the busy signal for the respective packet word responsive to the respective command complete signal.

44. A method of generating a plurality of command signals each of which corresponds to at least a portion of at least one packet word in a respective command packet, comprising:

storing at least a portion of a packet word in each command packet as the command packet is received, the portion of the packet word being stored in one of a plurality of storage devices responsive to a respective select signal;

generating a busy signal corresponding to each storage device indicating that a portion of a packet word has been stored in the storage device;

generating at least one command signal corresponding to the stored portion of each packet word, the command signal corresponding to each packet word being generated for one command packet at a time;

examining the busy signals to determine which of the storage devices are storing a portion of a packet word by storing each busy signal in a latch circuit corresponding to each storage device responsive to a respective latch signal, and outputting the stored busy signal on an output terminal of the latch circuit; and applying a respective select signal to one of the storage devices to which a busy signal does not correspond, thereby causing the storage device receiving the select signal to store the portion of the received packet word, the respective select signal being applied by:

assigning a predetermined hierarchy to each of the latch circuits; and generating a select signal that is applied to a respective storage device responsive to the absence of a stored busy signal at the output terminal of the respective latch circuit and the presence of a stored busy signal at the output terminal of latch circuits that are lower in the hierarchy of latch circuits.

45. The method of claim 44, further including the step of generating a trigger signal for each latch circuit after a latch signal is applied to the latch circuit, and wherein the step of generating at least one command signal corresponding to the stored portion of each packet word comprises generating at least one command signal corresponding to the stored portion of each packet word responsive to the trigger signal.

46. The method of claim 44, further including the step of generating a trigger signal for each latch circuit after a latch signal is applied to the latch circuit, and wherein the step of generating a busy signal corresponding to each storage device comprises generating a busy signal corresponding to each storage device after storing a portion of a packet word in the latch circuit corresponding to the storage device responsive to a respective trigger signal.

47. The method of claim 44 wherein the step of generating the command complete signal for each stored portion of each packet word comprises;

loading a counter with a count determined by the portion of the packet word stored in a respective one of the storage devices;

incrementing or decrementing the counter responsive to the respective select signal applied to the respective storage device;

detecting predetermined counts of the counter; and generates a plurality of command signals responsive to respective predetermined counts of the counter.

48. The method of claim 44, further including the steps of generating a command complete signal after the command signal corresponding to the stored portion of the respective packet word has been generated, and terminating the busy signal corresponding to the storage device in which the portion of the packet word is stored responsive to the respective command complete signal.

49. The method of claim 48 wherein the step of generating the command complete signal for each stored portion of each packet word comprises;

loading a counter with a count determined by the portion of the packet word stored in a respective one of the storage devices;

incrementing or decrementing the counter responsive to the respective select signal applied to the respective storage device;

detecting a predetermined count of the counter; and generating the command complete signal in response to detecting the predetermined count.

* * * * *

UNITED STATES PATENT AND TRADEMARK OFFICE
CERTIFICATE OF CORRECTION

PATENT NO. : 6,484,244 B1
DATED : November 19, 2002
INVENTOR(S) : Troy A. Manning It is certified that error appears in the above-identified patent and that said Letters Patent is hereby corrected as shown below:

Title page,
Item [56], References Cited, U.S. PATENT DOCUMENTS, insert omitted reference
-- 5,312,068  1/82  Goss et al.......31/37 --
"5,471,430 A 11/1995 Sawada et al." should read -- 5,471,430 A 10/1995 Sawada et al. --
FOREIGN PATENT DOCUMENTS, omit duplicate reference "EP 0 468 480 A2 5/1992"
OTHER PUBLICATIONS, "Draft Standard for a High-Speed" reference, "(Sync" should read -- (Sync- --

Column 2,
Line 34, "operator or an electronic" should read -- operator of an electronic --
Line 45, "disk drives floppy disk" should read -- disk drives, floppy disk --

Column 5,
Line 64, "command word" should read -- command word. --

Column 6,
Line 31, "40 bits" should read -- 40-bit --

Column 7,
Line 21, "compliment of the" should read -- complement of the --
Line 35, "compliments" should read -- complements --
Line 60, "and the S0 output" should read -- and the SO output --

Column 9,
Line 3, "generated a sequence" should read -- generate a sequence --
Line 30, "signals terminates" should read -- signal terminates --
Line 54, "CRSE_VERN<0:5>is" should read -- CRSE_VERN<0:5> is --

Column 10,
Line 6, "count of counter" should read -- count of the counter --
Line 33, "that the counters 340" should read -- that the counter 340 --
Line 55, "are applied to" should read -- and are applied to --
Line 60, "Bits 1-3 are CMD-" should read -- Bits 1-3 of CMD- --

UNITED STATES PATENT AND TRADEMARK OFFICE
CERTIFICATE OF CORRECTION

PATENT NO. : 6,484,244 B1
DATED : November 19, 2002
INVENTOR(S) : Troy A. Manning It is certified that error appears in the above-identified patent and that said Letters Patent is hereby corrected as shown below:

Column 13,
Line 55, "logic circuit generating" should read -- logic circuits generating --

Column 14,
Line 51, "complete signal" should read -- complete signals --

Column 16,
Line 48, "logic circuit" should read -- logic circuits --

Column 18,
Line 26, "logic circuit generating" should read -- logic circuits generating --

Column 20,
Line 36, "generates a plurality" should read -- generating a plurality --

Signed and Sealed this

Twenty-sixth Day of October, 2004

JON W. DUDAS
*Director of the United States Patent and Trademark Office*